United States Patent [19]
Bhatt et al.

[11] Patent Number: 6,093,335
[45] Date of Patent: *Jul. 25, 2000

[54] METHOD OF SURFACE FINISHES FOR ELIMINATING SURFACE IRREGULARITIES AND DEFECTS

[75] Inventors: Ashwinkumar C. Bhatt, Endicott; John Christopher Camp, Owego; Subahu Dhirubhai Desai, Vestal; Voya Rista Markovich, Endwell; Michael Wozniak, Vestal, all of N.Y.

[73] Assignee: International Business Machines Corporation, Armonk, N.Y.

[ * ] Notice: This patent is subject to a terminal disclaimer.

[21] Appl. No.: 08/974,210

[22] Filed: Nov. 20, 1997

Related U.S. Application Data

[63] Continuation-in-part of application No. 08/758,272, Nov. 19, 1996, Pat. No. 5,893,983, and application No. 08/704,193, Aug. 28, 1996, Pat. No. 5,759,427.

[51] Int. Cl.⁷ ..................................................... B44C 1/22
[52] U.S. Cl. .............................. 216/91; 216/92; 216/105; 216/106
[58] Field of Search ............................... 216/91, 92, 105, 216/106

[56] References Cited

U.S. PATENT DOCUMENTS

| | | |
|---|---|---|
| 4,604,799 | 8/1986 | Gurol . |
| 4,693,959 | 9/1987 | Ashcraft . |
| 4,702,792 | 10/1987 | Chow et al. . |
| 4,775,611 | 10/1988 | Sullivan . |
| 4,861,640 | 8/1989 | Gurol . |
| 4,954,142 | 9/1990 | Carr et al. . |
| 5,084,071 | 1/1992 | Nenadic et al. . |
| 5,118,385 | 6/1992 | Kumar et al. . |
| 5,308,796 | 5/1994 | Feldman et al. . |
| 5,358,622 | 10/1994 | Korsten . |
| 5,468,409 | 11/1995 | Dull . |
| 5,494,781 | 2/1996 | Ohtani et al. . |
| 5,502,893 | 4/1996 | Endoh et al. . |
| 5,759,427 | 6/1998 | Cibulsky et al. ........................ 216/91 |

FOREIGN PATENT DOCUMENTS

| | | |
|---|---|---|
| 000499314 | 8/1992 | European Pat. Off. . |
| 60-6462 | 1/1985 | Japan . |
| 63-318750 | 12/1988 | Japan . |
| 404065832 | 3/1993 | Japan . |
| 405109713 | 4/1993 | Japan . |

*Primary Examiner*—Edward J. Cain
*Attorney, Agent, or Firm*—William N. Hogg

[57] ABSTRACT

A method for planarizing an exposed metal surface on a substrate is provided in which surface irregularities are eliminated. A photoresist layer is first removed from the substrate. Then a conformal planarizing head is placed in contact with the metal surface while chemical etchant essentially free of abrasives is supplied to an interface between the metal substrate and the planarizing head. The surface is then planarized until it is free of irregularties.

8 Claims, 5 Drawing Sheets

METHOD OF SURFACE FINISHES FOR ELIMINATING SURFACE IRREGULARITIES AND DEFECTS

RELATED APPLICATION

The present application is a continuation-in-part of application Ser. No. 08/758,272, filed on Nov. 19, 1996, now U.S. Pat. No. 5,893,983 entitled "Technique for Removing Defects from a Layer of Metal" (Attorney Docket No. EN9-96-048) and application Ser. No. 08/704,193, filed Aug. 28, 1996 now U.S. Pat. No. 5,759,427 entitled "Method and Apparatus for Polishing Metal Surfaces" (Attorney Docket No. EN9-96-014). The present application is also related to application Ser. No. 08/495,277, filed Jun. 23, 1995, entitled "Method of Producing Fine-Line Circuit Boards Using Chemical Polishings" (Attorney Docket No. EN9-95-021).

FIELD OF THE INVENTION

This invention relates generally to the polishing of metal surfaces on substrates, and more particularly to the conditioning and planarizing of a top surface of a printed circuit board by removing a set amount of metal from the top surface.

BACKGROUND INFORMATION

Circuit boards provide a substantially planar surface on which electronic components can be mounted. Circuit paths for the components are provided by forming conductive lines on the circuit board that connect component-mounting through-holes in the board. Electrical leads that extend from the components are electrically connected to the conductive lines when the components are mounted to the board through-holes. Circuit boards can be single-sided, in which case components are mounted only on one surface of the circuit board, or circuit boards can be double-sided, in which case components can be mounted to both surfaces of the board. Generally, a single-sided board comprises a non-conductive substrate, such as a glass fiber-resin combination, with conductive lines formed on the board surface opposite the component mounting surface. A double-sided board typically comprises a central conductive layer clad on top and bottom surfaces with non-conductive separation layers, with conductive lines formed on one or both board surfaces.

Printed circuit boards are generally manufactured using either a subtractive etch process, an acid plate pattern plating process, or an electroless pattern plating process. The electroless plating process is also referred to as additive pattern plating. In all of these processes, a circuit mask that lays out the desired pattern of the conductive lines is transferred to the circuit board by printing the circuit mask pattern onto a polymeric radiation-sensitive resist material deposited on the board. The resist material is irradiated in the pattern of the circuit mask so that it is physically transformed where it is irradiated and is unchanged where shielded by the circuit mask. The resist material thereafter can be developed by exposing it to a fast-reacting chemical solution that selectively removes either the irradiated material (called a positive-tone resist) or removes the non-irradiated material (negative-tone resist).

The subtractive etch process typically begins with a board substrate comprised of a non-conductive material on which a layer of conductive material such as a metal is plated. One such metal which can be used as this conductive material is copper. A layer of resist material is then deposited and developed in the circuit mask pattern so as to expose the conductive material where circuit paths are not desired. The exposed conductive material in the resist voids is then etched away. Finally, the remaining resist material is removed, leaving behind conductive lines wherever circuit paths were desired.

The subtractive etch process provides good control over circuit path height because the amount of conductive material plated onto the substrate generally can be controlled rather well. Precisely controlled circuit path height is especially important with surface mount techniques. Unfortunately, the subtractive etch process does not provide precise control over circuit path width, due to plating variation and lack of sharply defined path edges. The lack of width control is disadvantageous with current demands for increasingly high component mounting densities that require relatively thin conductive lines placed in close proximity to each other.

The acid plate pattern plating process uses electroplating techniques to deposit conductive lines in circuit paths defined by resist material voids. That is, conductive foil layer on the circuit board is connected to an electrode and the conductive material is deposited onto the board in the resist material voids using an oppositely charged electrode. The width of the conductive lines is generally dependent on the developed resist pattern, which typically is of photographic sharpness. Pattern plating thereby provides good control over circuit path width and permits conductive lines of relatively fine width. The circuit path height, however, can vary greatly depending on the density of the desired conductive lines. In particular, isolated conductive lines are thicker than densely packed conductive lines. Thus, line height is not precisely controlled by the acid plate process. The additive plate process is similar to the acid plate process, except that chemical plating techniques are used rather than electro-plating techniques. Additive plate fabrication generally requires more time to complete as compared to acid plate fabrication but is not as susceptible to circuit path height variation according to line density. Height variations for additive plate fabrication, however, experiences height variation from side to side differences as well as copper module formation.

As stated above there are several different methods of plating and creating printed circuit lines on substrates such as circuit boards and circuit cards which are presently in use. Of these, additive panel plating is utilized to control both line height and line width. However, this method is costly and time-consuming. The above disclosed related application describes a method of producing fine-line circuit boards using chemical polishing. As disclosed therein, the printed circuit board is produced from an initial substrate board coated with a resist layer. The resist layer is patterned according to a circuit mask that defines circuit paths. The pattern resist layer is then selectively removed from the board in the desired circuit paths, and a conductive material is deposited on the board in the areas where the resist was removed as defined by the circuit mask. The conductive material is deposited so that the height of the conductive material relative to the substrate board equals or exceeds the height of the resist layer relative to the substrate board. In a first etching step, a low reactive solution is applied over the conductive material and slowly dissolves it by first forming a film layer. Mechanical contact is then used to remove this film layer on any surface above the resist layer. The removal of the thin film layer allows a new conductive material surface layer to be exposed to the solution, and a new film layer to be formed. This process continues until the height of the resist layer is reached. At this point, when contact with the conductive material cannot be made without contacting the resist layer, a final film layer is formed. This final film layer then becomes a barrier to the low reactive solution and, in fact, on any area that is below the resist layer, such as a plated through hole. In this way, no abrasive materials are used in ensuring that the height of the conduct line will be substantially uniform and will conform to substrate undulations and surface irregularities. Conductive line width control is defined by the developed resist image. Circuit boards are then produced so as to have uniform height and precise width, even with organic flexible composition substrates. The etching solution is applied, allowed to react and form a barrier, then removed. Then, a new solution is applied, the barrier is formed, and the barrier is removed. This process is repeated until an essentially planarized surface of copper circuitry is obtained. Also, if the surface of the product is relatively regular and uniform, the card may be inspected using an automatic optical inspection ("AOI") system. Due to surface irregularities inherent to this process, however, AOI systems cannot be used. This results in high scrap and defective product. These irregularities on the metal surface features are typically caused by either the pattern plate itself or the post-process operations. Furthermore, these irregularities produce an excessive number of re-calls or product that is untestable by the AOI system.

While this technique is quite effective in producing a good planarized surface, nevertheless, it is essentially a batch process, as opposed to a continuous process, and requires iterative repetition of the forming and removing of the barrier and checking the height. This is time-consuming and requires significant manual operator involvement with significant operator judgment involved. Thus, while this process is effective, it is somewhat slow, especially if a large reduction in height of the circuit lines is required. Furthermore, the surface irregularities resulting from this process prevent automatic optical inspection of the resulting product. Therefore it is an object of the present invention to provide an improved process for planarizing metal surfaces on a substrate material.

SUMMARY OF THE INVENTION

A method for chemically planarizing an exposed surface of metal on a substrate is provided wherein most, if not all, of irregularities existing on the metal surface are eliminated. The substrate has an exposed metal surface which is to be planarized. Typically, the metal surface will be circuitry. To eliminate any irregularities in the metal surface, a photo resist layer is first removed. Then, a conformal planarizing head is provided which is continuously moving with respect to the substrate. The planarizing head is placed in contact with the metal surface on the substrate while a chemical etchant is continuously supplied to the interface between the metal surface and the planarizing head. The chemical etchant is essentially free of abrasive material the planarizing continues until a pre-determined level of the metal surface is reached to produce a surface free of irregularities.

DESCRIPTION OF THE PREFERRED EMBODIMENT

Figure 1:
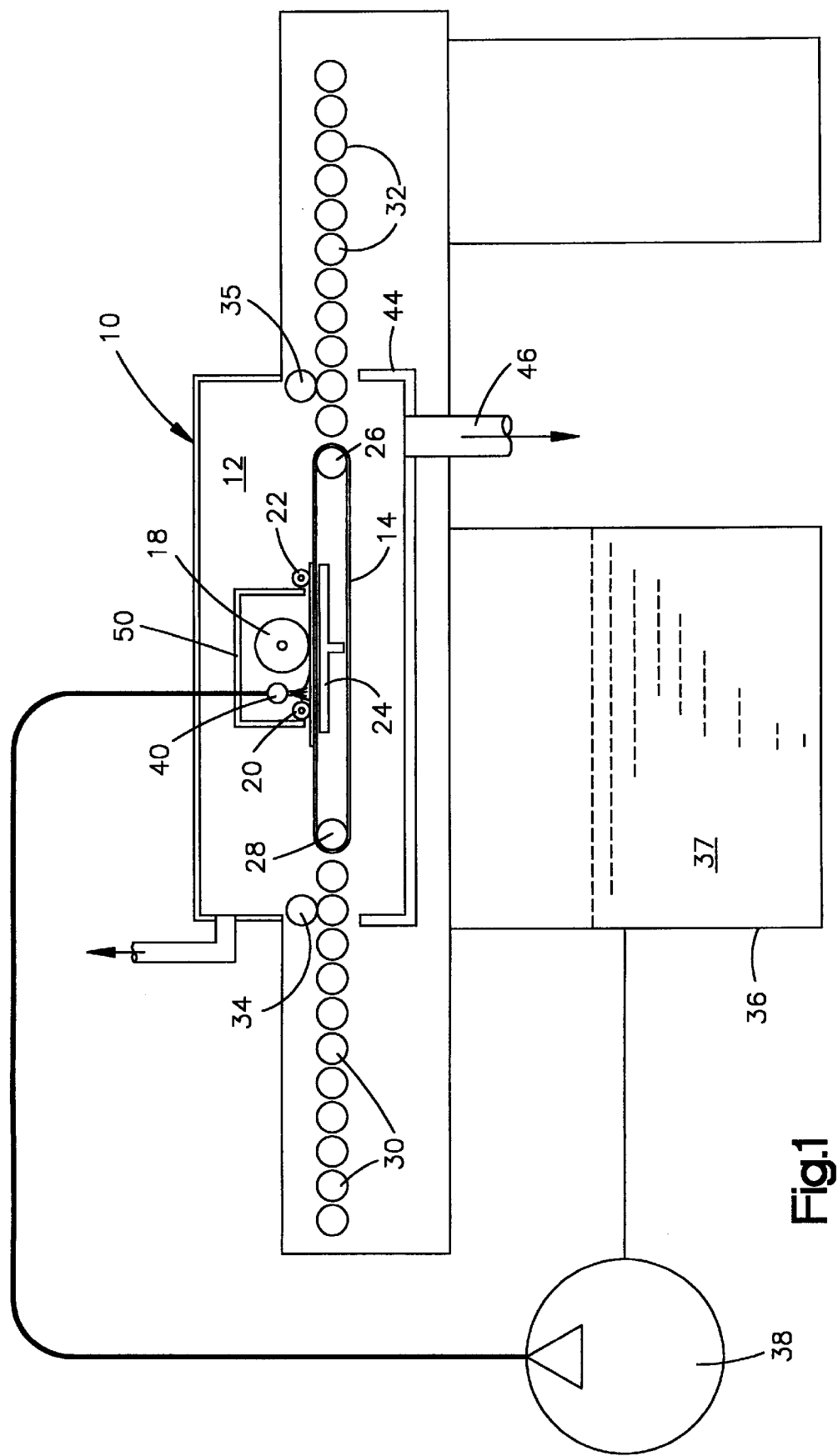
FIG. 1 is a side elevational view somewhat diagrammatic, with parts broken away for clarity, of a planarizing device according to this invention.
Figure 2:
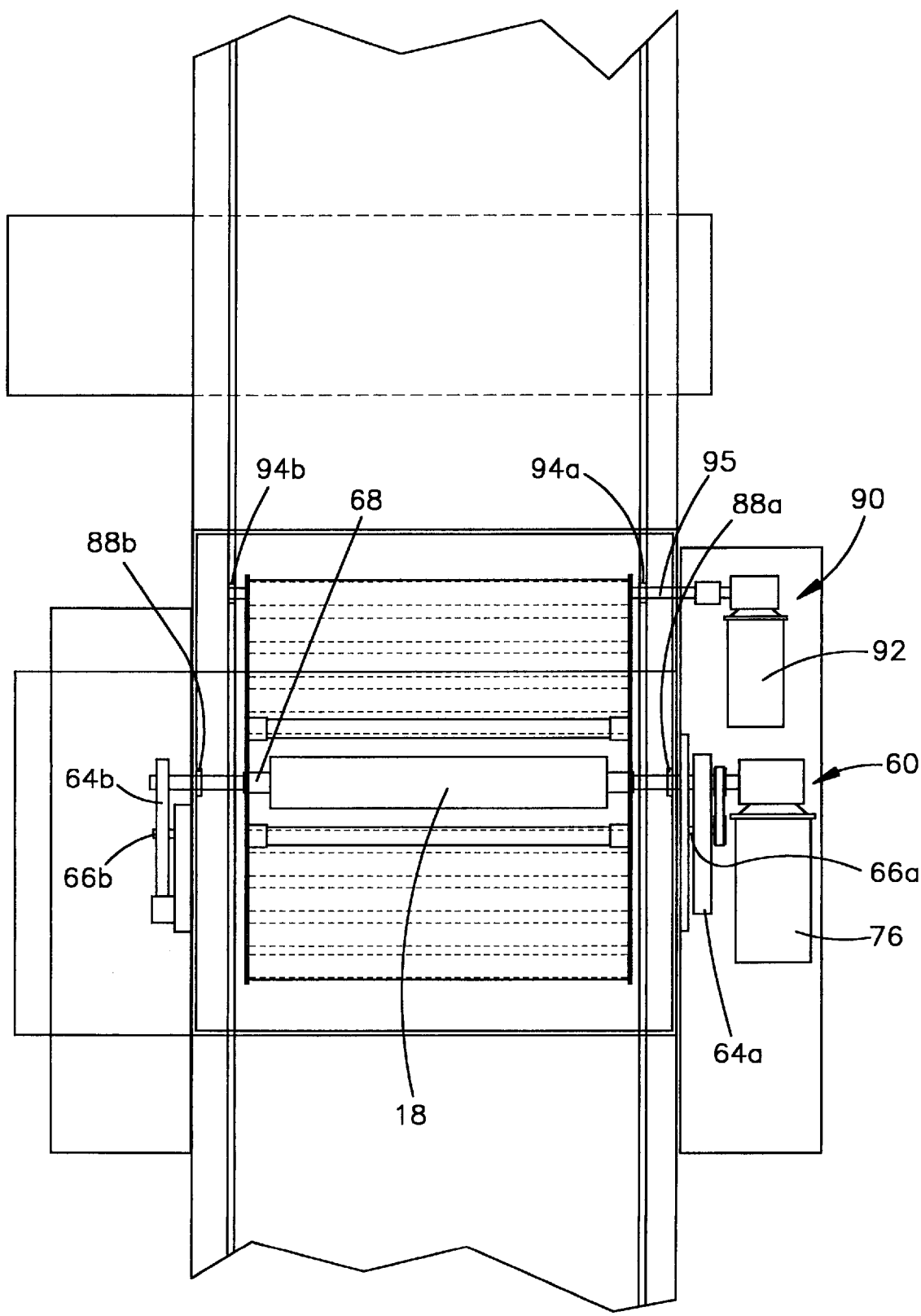
FIG. 2 is a top plan view of the device of this invention, with parts broken away for clarity, in an enlarged scale from FIG. 1.
Figure 3:
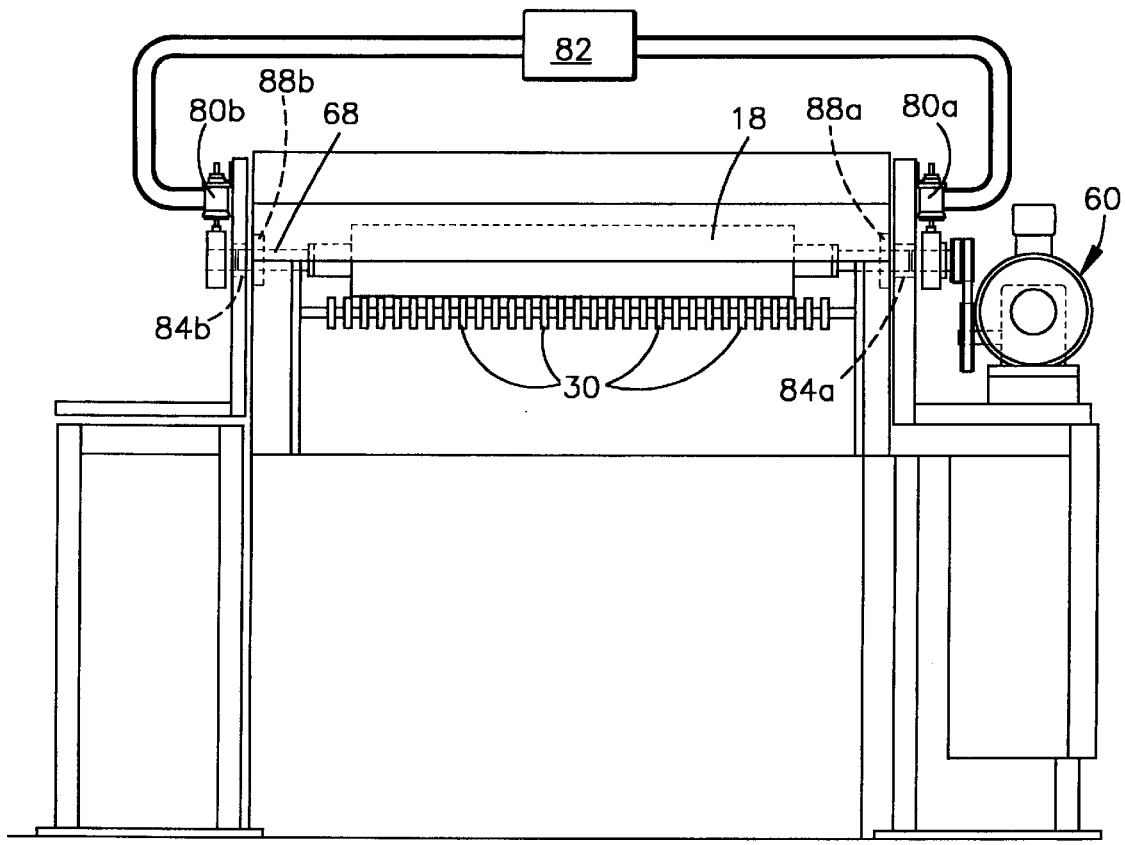
FIG. 3 is an end elevational view of the device of this invention, with parts broken away for clarity.
Figure 4:
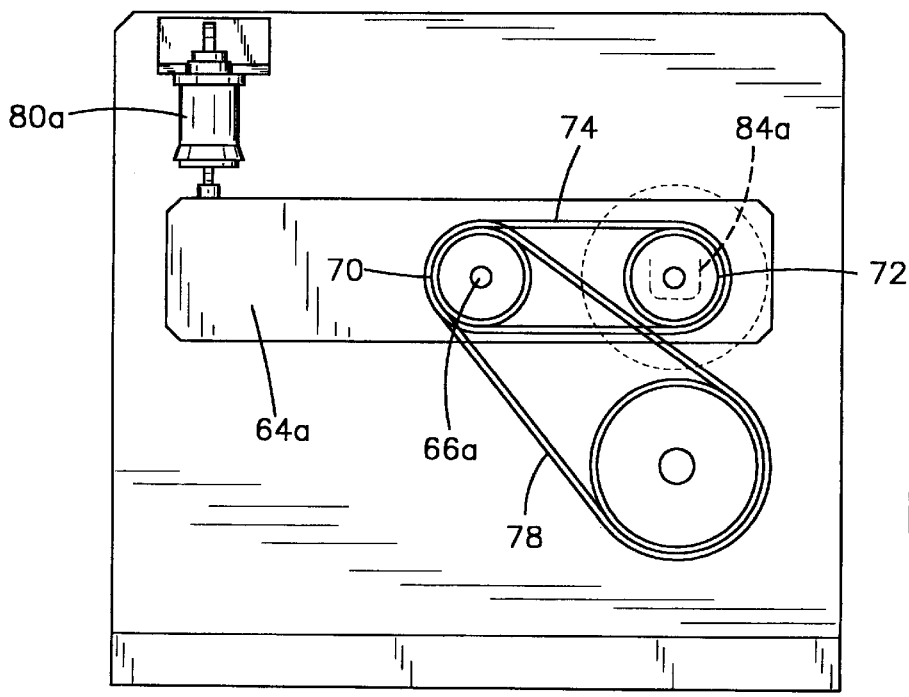
FIG. 4 is a side elevational view of the mounting of one side of the planarizing head according to this invention.
Figure 5:
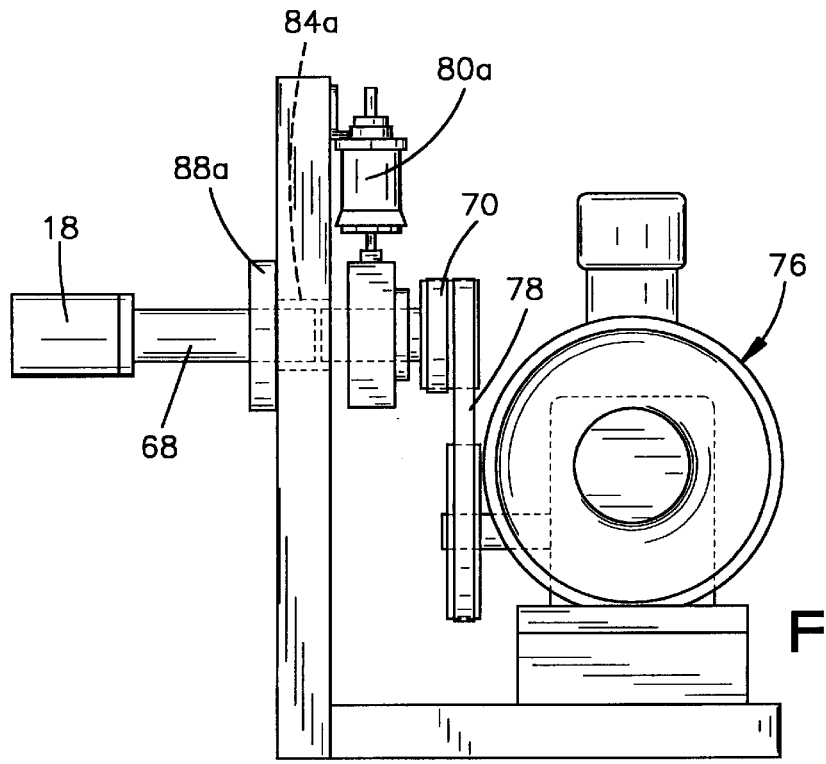
FIG. 5 is an end elevational view of the mounting shown in FIG. 4.
Figure 6:
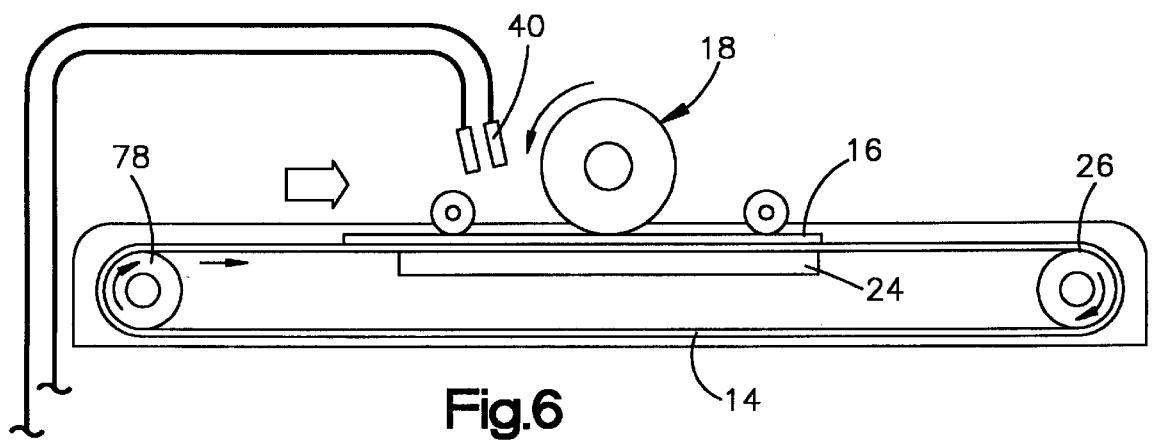
FIG. 6 is a schematic representation of the progress of the workpiece through the device.

Referring now to the drawings, and for the present to FIGS. 1 through 6, a planarizing device according to the present invention is shown. The device includes a work chamber housing, designated generally as 10, defining a work chamber 12 therein. Contained within the work chamber 12 is a conveyor belt 14 to support workpieces, one of which is shown at 16 thereon (FIG. 6). The workpieces will be described in more detail presently. A cylindrical planarizing head 18 is also contained within the work chamber 12 carried by mountings which will be described presently. A pair of pinch rolls 20 and 22 are mounted for rotation on opposite sides of the planarizing head 18 on bearings (not shown), and a pressure plate 24 is mounted below the top surface of the conveyor. A drive roll 26 and an idler roll 28 are provided for driving the conveyor belt 14, the mounting of which will be described presently. Also disposed within the work chamber housing 10 are entrance rollers 30 and exit rollers 32 which are individually driven in a well-known manner to provide for supplying and discharging workpieces to and from the conveyor belt 14. Pinch rolls 34 and 35 may also be provided above the rollers 30 and 32 as shown.

An etchant supply tank 36 is provided which is configured to hold a liquid etchant 37. A pump 38 is connected to the etchant supply tank 36 and to a spray head 40 positioned between the pinch roll 20 and planarizing head 18.

A collection tray 44 is also disposed within the work chamber housing 12 and positioned to collect the unused and spent etchant from the workpieces as they exit the conveyor. The collection tray 44 has a drain 46 which allows the spent etchant to drain either for recovery or for waste disposal. A splash guard 50 surrounds the planarizing head 18 and spray head 40 to prevent splashing and spraying of the etchant.

As can best be seen in FIGS. 2–6, the planarizing head 18 is mounted on a planarizing head mounting designated generally as 60. The planarizing head 18 must be conformal in that it will substantially ride on top of a metal surface of a substrate when in contact with that surface. The planarizing head mounting 60 includes a pair of pivot arms 64a and 64b mounted on opposite sides of the housing 10 on pivot pins 66a and 66b, respectively. Self-aligning bearings (not shown) mount shaft 68 of the planarizing head to one end of each of the pivot arms 64a and 64b. Sheave 70 is mounted on the pivot pins 66a and sheaves 72 is mounted on the end of the shaft 68. Belt 74 connects sheaves 70 and 72. A motor 76 is mounted on one side of the housing 10 and is connected through belt 78 to sheave 70. Therefore, rotation of the motor 76 will cause the belt 78 to drive the sheaves through belts 78 and 74 thus rotating the planarizing head 18.

Pneumatic pressure arm assemblies 80a and 80b are connected respectively to the ends of pivot arms 64a and 64b opposite the ends to which the shaft 68 is attached. Each of the assemblies 80a and 80b is connected to a pneumatic controller 82. The shaft 68 passes through U-shaped openings 84a and 84b on opposite sides of the housing 10, such that movement of the pivot arms 64a and 64b about pivot pins 66a and 66b will allow the shaft 68, and thus the planarizing head 18, to move toward and away from the conveyor belt 14. The mounting of the planarizing head in order to insure it running parallel to the conveyor belt 14 is especially important. In order to seal the U-shaped openings 84a and 84b, disc seals 88a and 88b are mounted on the opposite ends of the shaft 68 adjacent the interior of the U-shaped openings 84a and 84b.

The drive roll 26 is connected to a drive shaft assembly 90, which includes a drive motor 92 and bearings 94a and 94b mounting drive roll shaft 95 on opposite sides of the housing 10. The idler roller 28 is mounted within the work chamber 12 on bearings (not shown).

In operation, the device planarizes workpieces using essentially a chemical etchant without the addition of abrasives thereto. Specifically, the etchant should be substantially devoid of pumice. Typically the etchant can be cuprichloride and hydrochloric acid or any other conventionally known etchant substantially deviod of abrasives.

Figure 8:
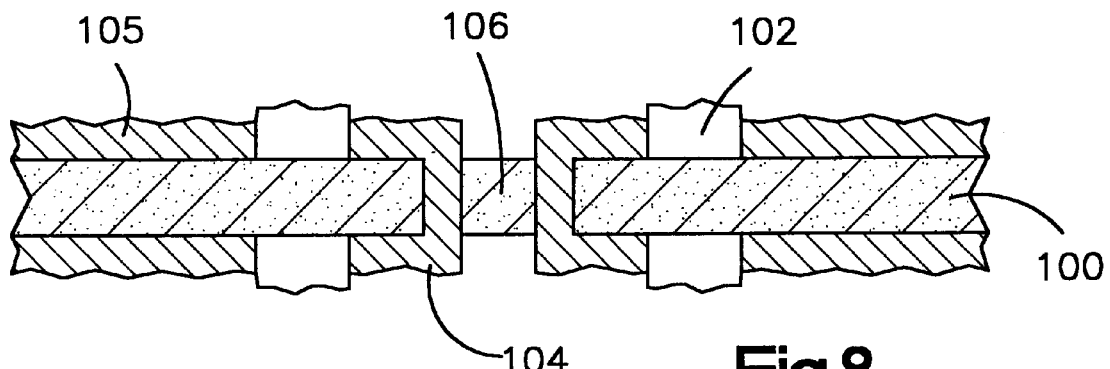
FIG. 8 is a longitudinal sectional view of a portion of a circuit board before being processed using the method of the present invention, shown somewhat schematically.

To eliminate the surface irregularities that prevent optical inspection which ultimately leads to scrapping the product, in the present invention the top surface of the printed circuit board is conditioned to make AOI possible by removing about one (1) to about two (2) microns of the metal off or from the surface. As can be seen in FIG. 8, these surface irregularities are often in the form of bumps or raises 105 that extend up from the metal surface 104. While these bumps 105 extend up from the surface, since the photoresist 102 is higher, the bumps cannot be eliminated until the photoresist 102 is removed. By removing this amount of metal represented by the bumps 105 from the surface 104, the resulting printed circuit board does not have the irregularities that prevent AOI testing.

As can be seen in FIG. 8 a substrate 100 is provided having a metal surface 104 which is usually circuitry. Typically the substrate will be a laminate. As stated above, the substrate 100 is provided with a metal surface such as copper plate. Furthermore, this metal surface 104 is in the form of circuitry. The circuitry pattern is formed by photoresist 102 interspered within, between and/or around the metal surface 104 as in known in the art. In one embodiment, the photoresist 102 is T-168 photoresist manufactured by DuPont. The photoresist 102, however, could be any conventional photoresist as is known in the art. FIG. 8 illustrates that this metal surface 104 tends to be irregular and rough and in the form of raised bumps 105 as mentioned above. Also, FIG. 8 illustrates that the substrates 100 with metal surfaces 104 typically have plated through holes 106.

Figure 8A:
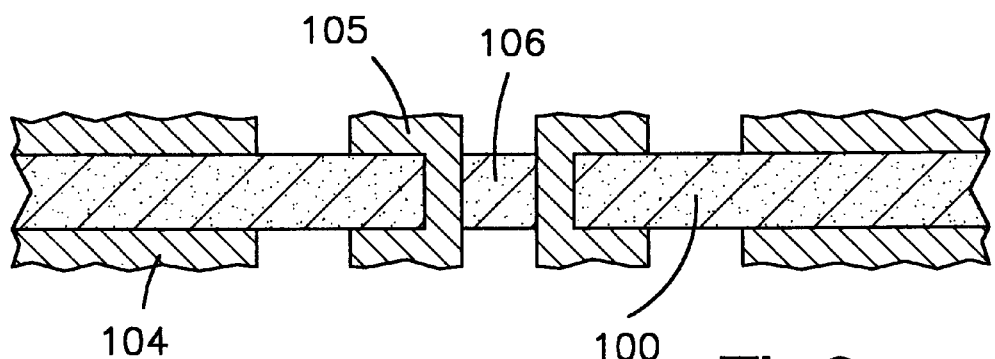
FIG. 8a is a longitudinal sectional view of a portion of a circuit board after the photoresist layer has been removed, shown somewhat schematically.

To eliminate the surface irregularities, substantially all photoresist 102 is removed from the substrate 100 before planarizing as is shown in FIG. 8a. In one embodiment, the photoresist 102 is removed by a strip process as disclosed in U.S. Pat. No. 5,268,260. It is contemplated, however, that the photoresist can be removed by other conventional methods. After the photoresist layer is substantially removed, the substrate 100 is planerized using the apparatus described above. The planarizing process is performed with the etchant substantially free of abrasives. The planarizing is conducted until a pre-determined depth of metal surface 104 is removed. Typically, about one (1) to about two (2) microns of metal are planarized from the metal surface 104. Since a only a small amount of metal surface 104 is to be removed, the planarizing can usually be accomplished in one pass through the planarizing apparatus. Thus, by planarizing the metal surface 104 of the substrate 100 to a pre-determined level, irregularities in the metal surface 104 are eliminated so that the resulting assembly may be inspected for defects using AOI.

Figure 9:
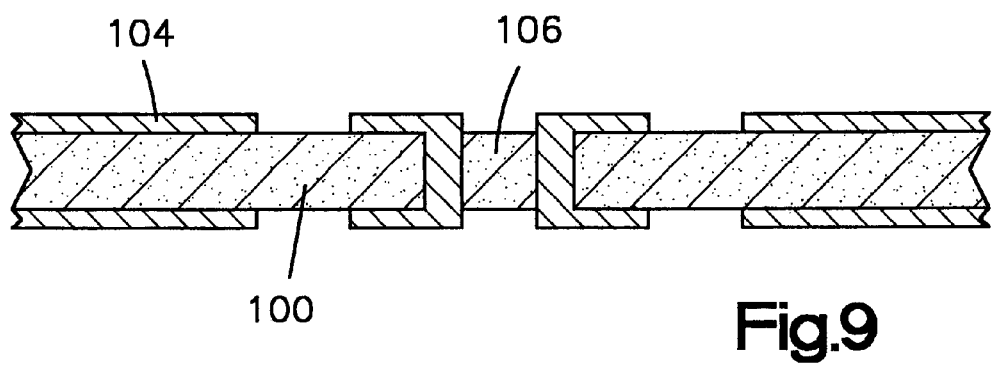
FIG. 9 is a longitudinal cross-sectional view of a portion of a circuit board after being processed using the method of the present invention, shown somewhat schematically.

Referring further to FIG. 8, a portion of a substrate 100 is shown schematically, processed to a point where planarization is to take place. Such processing is described in U.S. patent application Ser. No. 08/495,277 and need not be described further. Essentially, the circuit board to be planarized has a substrate 100 on which is deposited photoresist 102 which has been patterned to receive circuitry 104 formed thereon by conventional plating techniques as described therein. The circuitry includes plated through holes 106, extending from one side of the substrate 100 to the opposite side of the substrate. As can be seen in FIG. 8, the top surface of the circuitry 104 is rather irregular (i.e. non-planar). The purpose of the planarizing is to remove this excess of metal so as to form a smooth top surface of the circuitry 104 which is essentially flat, smooth. To this end, the substrate 100, as shown in FIG. 8, first has the photoresist 102 removed and then is passed through the planarizing device. The substrate 100 is passed through the device with the device's planarizing head 18 rotating and planarizing etchant being applied. This is done in order to remove the excess metal extending above the photoresist 102 and resulting in the planarized surface as shown in FIG. 9. This is shown schematically in FIG. 6.

Depending upon how much metal has to be removed, the planarizing may be accomplished in a single step, i.e., a single pass through the planarizing device. During a pass through the device, the substrate is fed into the work chamber on rollers 30 to the conveyor 14 where it is passed underneath the pinch roll 20, and the conveyor belt 14 drives the workpieces 16 past the planarizing head 18 which is rotated as shown in FIG. 6.

The conveyor 14 is formed of an etchant-resistant material and preferably has a roughened surface to prevent the rotating planarizing head 18 from moving the workpiece on the conveyor 14. A preferable material for forming the conveyor is polyvinylchloride. The etchant solution 37 is supplied from the tank 36 by pump 38 to spray head 40, where it is applied to the surface of the workpiece 16. In a typical embodiment, the circuitry is formed of copper, and the preferred etchant 37 is cupric chloride and hydrochloric acid as described in the above noted application. It is to be understood that other metals, such as aluminum, can be used to form the circuitry, in which case other etchants, such as hydrochloric acid would be used.

The controller 82 controls the operation of the planarizing head 18 so as to position the planarizing head 18 above the moving conveyor and maintain parallel therewith and exert a downward force on the head 18 into contact with the surface of the workpiece 46. The etchant solution 37 is pumped from the tank 36 by pump 38 to spray head 40 where it is dripped onto the surface of the workpiece causing a chemical reaction to take place to dissolve the raised portion of the metal. The rotating head removes the reaction product as it is formed and brings new solution into contact with the revealed new surface of metal. The spent solution and reaction product are caught in the collection tray 44 and exhausted through the drain 46.

Figure 7:
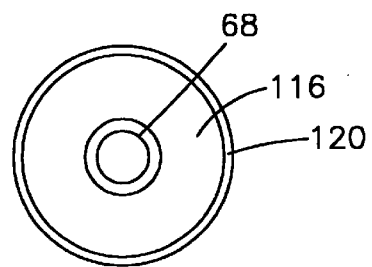
FIG. 7 is a transverse sectional view of one embodiment of a planarizing head according to this invention.

A roller 110 of the type shown in FIG. 7 is preferred. In this case, the planarizing head 18 is formed of a foamed covered roller 110 or other such sufficiently compliant material, bonded to the shaft 69 which shaft preferably is formed from PVC tubing, and a polyester film 120 of material having very fine silicon carbide particles embedded therein is applied over the foam roller 116. The silicon particles are preferably no larger than 15 microns and can range in size from about 15 microns to about 5 microns.

Accordingly, the preferred embodiments of the present invention has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A method of planarizing an exposed surface on a substrate in which the exposed surface comprises metal circuitry and a photoresist layer comprising the steps of:

a) providing a substrate having an exposed metal surface thereon to be planarized;

b) removing a photoresist layer from said substrate;

c) providing a conformal planarizing head;

d) continuously moving said planarizing head, whereby said planarizing head maintains contact with said exposed metal surface;

e) moving said substrate past said planarizing head;

f) depositing a chemical etchant essentially free of abrasive material to the interface between the exposed metal surface and the planarizing head;

g) allowing said etchant to remove said metal surface to pre-determined level.

2. The invention as defined in claim 1 wherein said conformal planarizing head is a roller rotated with respect to said metal surface and substantially maintains contact with said metal surface.

3. The invention as defined in claim 2 wherein said roller is foam.

4. The invention as defined in claim 1 wherein said metal surface is copper.

5. The invention as defined in claim 1 wherein said metal surface further comprises copper circuitry.

6. The invention as defined in claim 1 wherein said etchant comprises cupricchloride and hydrochloric acid.

7. The invention as defined in claim 5 wherein said copper circuitry is surrounded by a dielectric material above which said circuitry extends initially, and wherein said planarization is completed when the upper surface of said copper circuitry is substantially co-plannar with said surrounding dielectric material.

8. The invention as defined in claim 1 wherein said step of allowing said etchant to remove said metal surface removes about one micron to about two microns of metal from said metal surface.

* * * * *